United States Patent [19]

Muller

[11] Patent Number: 5,502,813
[45] Date of Patent: Mar. 26, 1996

[54] METHOD AND APPARATUS FOR TESTING AN NVM

[75] Inventor: Arno Muller, Westport, Conn.

[73] Assignee: Pitney Bowes Inc., Stamford, Conn.

[21] Appl. No.: 274,562

[22] Filed: Jul. 13, 1994

Related U.S. Application Data

[63] Continuation of Ser. No. 695,624, May 3, 1991, abandoned.

[51] Int. Cl.⁶ .................................................... G01R 31/28
[52] U.S. Cl. ................................. 395/183.01; 395/183.18
[58] Field of Search .......................... 371/21.1, 68.3, 371/16.1, 68.1, 62, 67.1, 10, 31, 13; 365/189, 218, 203; 395/183.01, 183.06, 183.07, 183.18

[56] References Cited

U.S. PATENT DOCUMENTS

| | | | |
|---|---|---|---|
| 4,578,774 | 3/1986 | Muller | 371/62 |
| 4,742,469 | 5/1988 | Haines et al. | 371/7 |
| 4,802,117 | 1/1989 | Chrosny et al. | 371/68.1 |
| 4,805,151 | 2/1989 | Terada et al. | 365/189 |
| 4,916,623 | 4/1990 | Check, Jr. | 371/68.1 |
| 4,953,129 | 8/1990 | Kobayashi et al. | 365/203 |
| 4,998,203 | 3/1991 | DiGiulio et al. | 371/62 |
| 5,021,963 | 6/1991 | Brown et al. | 371/13 |
| 5,170,044 | 12/1992 | Pastor | 371/6 |

*Primary Examiner*—Hoa T. Nguyen
*Attorney, Agent, or Firm*—Angelo N. Chaclas; Charles G. Parks, Jr.; Melvin J. Scolnick

[57] ABSTRACT

Apparatus for testing an NVM comprising, a microprocessor, a plurality of NVMs respectively connected to the microprocessor, each of the NVMs having an address space for storing data therein, and the microprocessor including, structure for selecting one of the plurality of NVMs structure for byte-write-mode writing data having a predetermined page size to the selected NVM for storage in the address space thereof, structure for page-write-mode writing different data having the predetermined page size to the selected NVM for storage in the address space thereof, and structure for counting the number of changed bytes in the address space of the NVM.

37 Claims, 4 Drawing Sheets

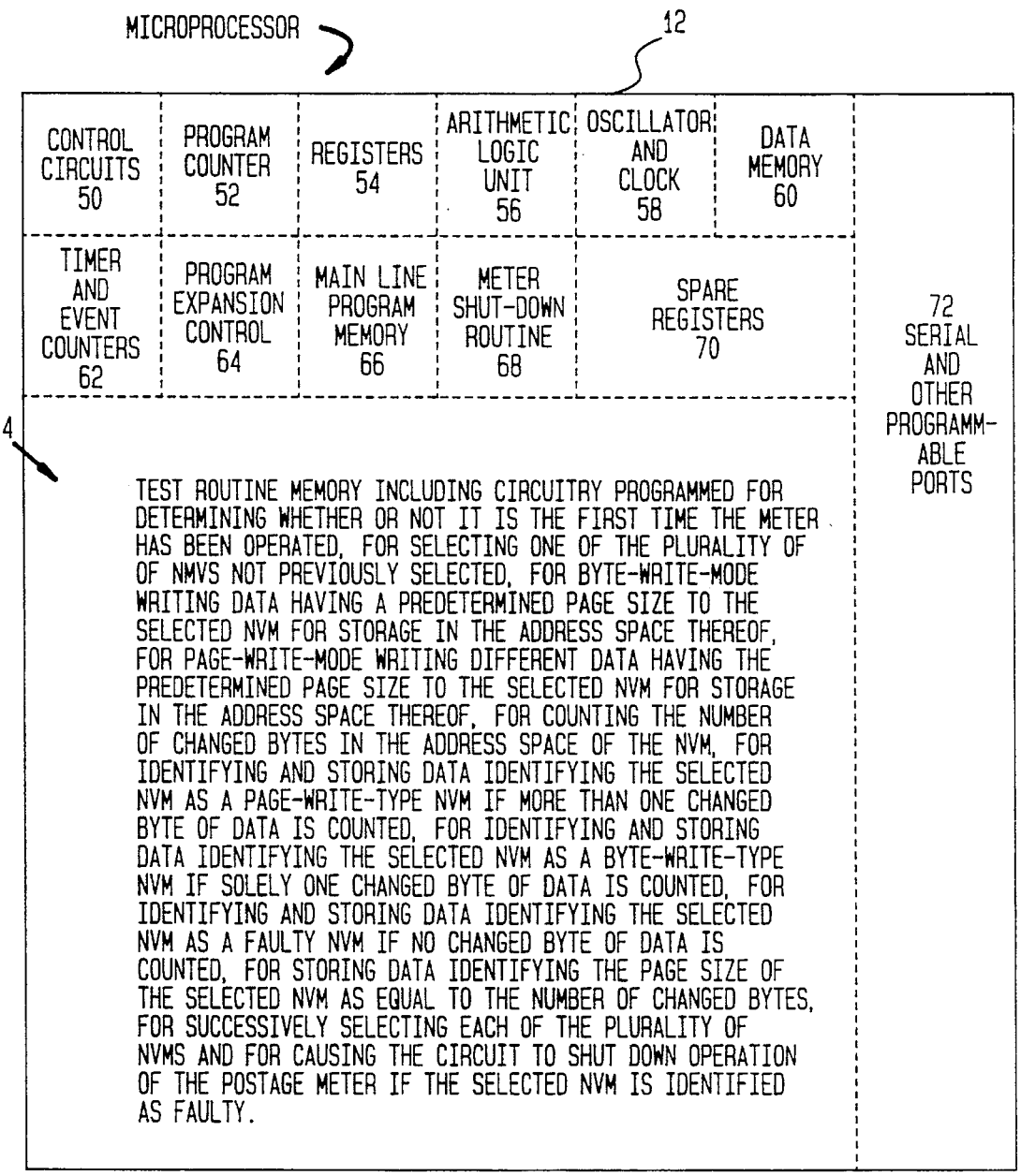

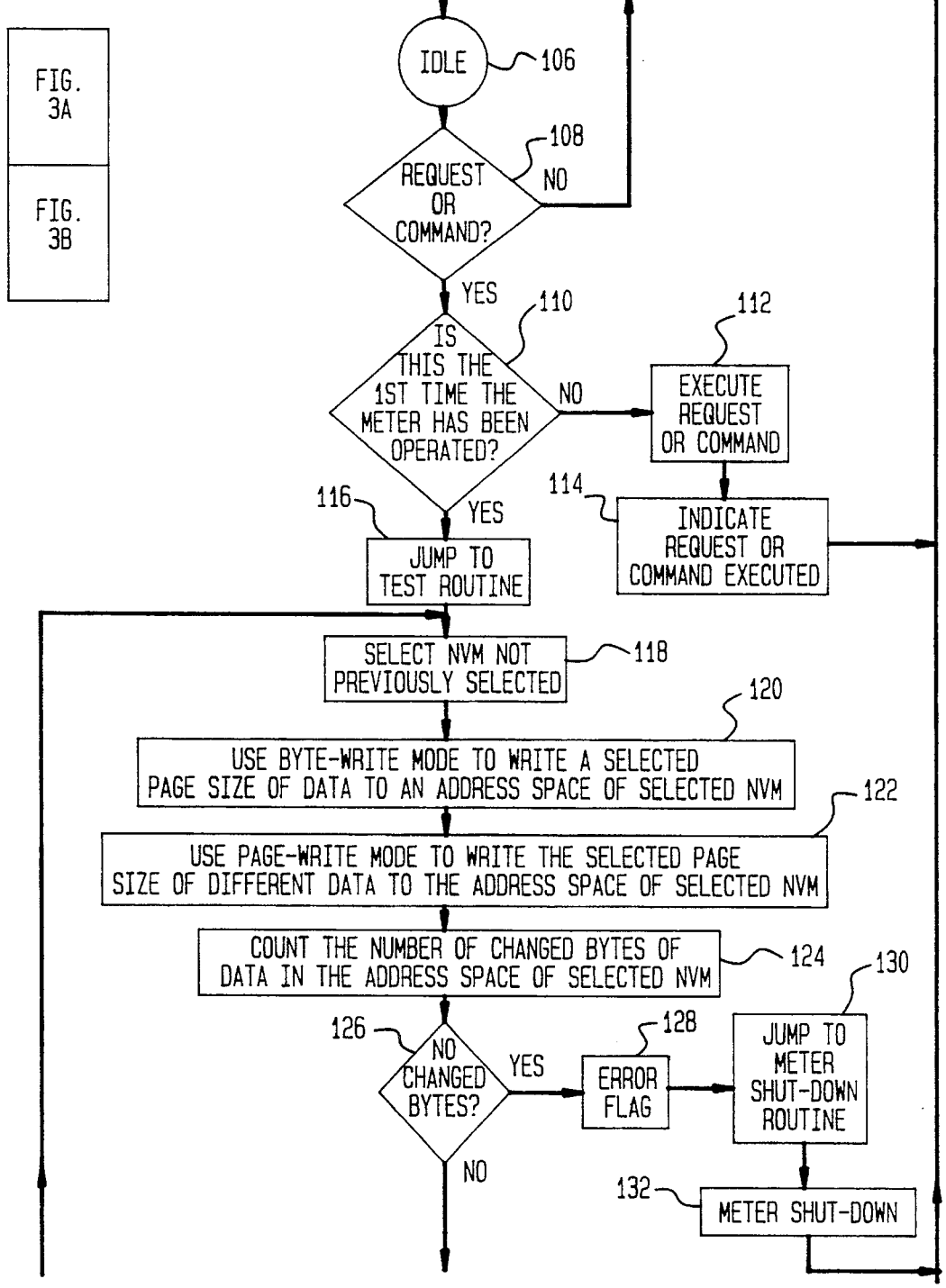

METHOD AND APPARATUS FOR TESTING AN NVM

CROSS REFERENCE TO RELATED APPLICATIONS

This application is a continuation of U.S. patent application Ser. No. 07/695,624, filed on May 3, 1991 which is now abandoned.

BACKGROUND OF THE INVENTION

This invention is generally concerned with a method and apparatus for testing an NVM and more particularly with methods and apparatus for identifying operational characteristics of an NVM.

Commercially available electronic postage meters are equipped with multiple non-volatile memory (NVMs) for redundantly storing critical data utilized in the course of operating the meter. For example, the serial number of the meter is preferably redundantly stored inasmuch as it is utilized for identifying the meter in the course of operation thereof when the meter is reset to store additional postage funds therein. In addition, data accounting for the total of postage funds available to be dispensed, and the total of all postage funds dispensed at any time, by the meter are normally stored in redundant NVM registers to ensure recovery, for example, after each power down cycle of the postage meter.

An additional step normally taken to guard against the loss of critical operational data is to use NVMs of different types from different manufacturers in the manufacture of the electronic postage meters. This step is taken to be sure that at least one of the redundant NVMs incorporated in each meter will survive in the event of a meter breakdown due to any eventuality, including for example, exposure to radiation, fire or physical destruction. Thus NVMs supplied by different suppliers of such products are preferably used for manufacturing each postage meter. On the other hand, different suppliers may provide NVMs having different operational characteristics, whether or not the per unit cost for each NVM is comparable. For example, a given supplier may provide NVMs which are byte-write-type NVMs, i.e., those which implement a programming mode of operation for storing a given byte of data immediately after the given byte is written thereto, whereas another supplier may provide NVMs which are page-write-type NVMs, i.e., those which implement a programming mode of operation for storing a predetermined number of bytes of data, say 16, 32 or 64 bytes, immediately after the predetermined number of bytes of data, known in the art as a page size, are written thereto.

Assuming the postage meter's electronic circuitry has been designed to use NVMs having a page size of 32 bytes, and not all NVM manufacturers provide that particular type of NVM and one or more selected manufacturers cannot timely provide a sufficient quantity of such NVMs to permit a given manufacturing run of postage meters to be completed, the timely manufacture of such postage meters is jeopardized. Accordingly, it is preferable that the electronic circuitry of the postage meter be designed to operate with byte-write-type or page-write-type NVMs, and that the page-write-type NVMs be those having any page size, i.e., 1, 16, 32, 64 or 128 byte page sizes, to provide for flexibility in choosing suppliers and accommodating changes in the availability of a sufficient number of NVMs at any given time. Moreover, in order to avoid a slow down in the manufacturing process by a postage meter manufacturer, and to take advantage of cost differentials which may be available from a given NVM supplier at any given time, it is preferable that the circuitry be designed to automatically accommodate and be operable with any available type of NVM.

Accordingly:

an object of the invention is to provide an improved postage meter;

another object is to provide a method and apparatus for testing an NVM; and yet another an object is to provide an electronic circuit including means for testing a selected NVM to identify operational characteristics thereof.

SUMMARY OF THE INVENTION

Apparatus for testing an NVM comprising: a microprocessor; a plurality of NVMs respectively connected to the microprocessor, each of the NVMs having an address space for storing data therein; and the microprocessor including: means for selecting one of the plurality of NVMs; means for byte-write-mode writing data byte-after-byte having a predetermined page size to the selected NVM for storage in the address space thereof; means for page-write-mode writing different data byte-after-byte having the predetermined page size to the selected NVM for storage in the address space thereof; and means for counting the number of changed bytes in the address space of the NVM inn both byte-write-mode and page-write-mode for testing operational characteristics of the NVM dependent on the result of counted changed bytes.

BRIEF DESCRIPTION OF THE DRAWINGS

FIG. 2 is a block diagram of the microprocessor of FIG. 1, showing major structural components of the microprocessor.

DESCRIPTION OF THE PREFERRED EMBODIMENTS

Figure 1:
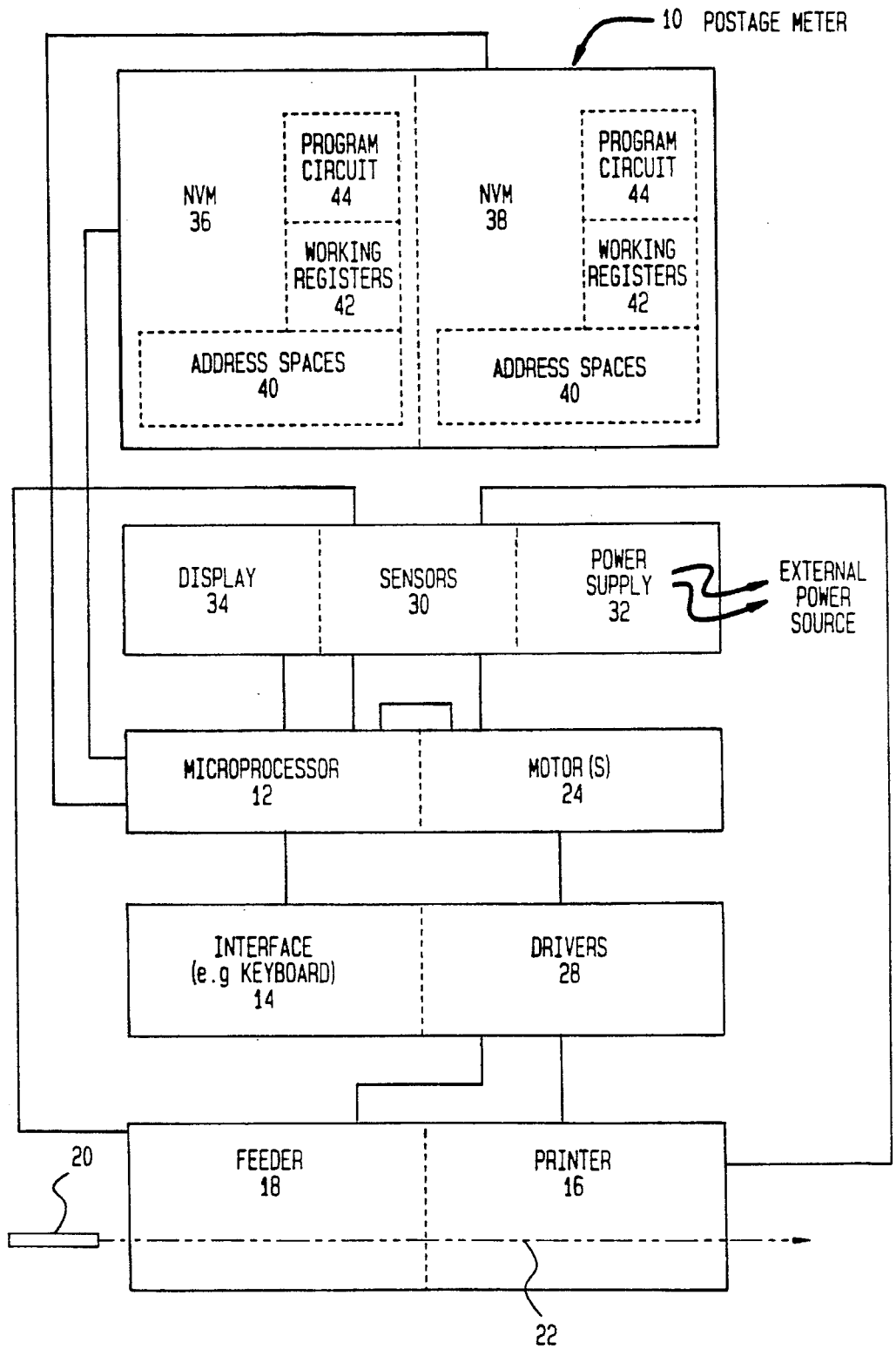
FIG. 1 is a block diagram of a conventional electronic postage meter according to the invention, showing major structural components thereof including a microprocessor.

As shown in FIG. 1, a conventional electronic postage meter 10 which may be modified according to the invention generally includes a conventional microprocessor 12 for controlling the various structures and functions of the meter 10. In addition, the meter 10 includes an operator interface 14, such as a keyboard, which is conventionally coupled to the microprocessor 12 for operation of the meter 10 in response to signals from the interface 14 which correspond to requests or commands entered into the interface, for example by an operator. The meter 10 additionally includes conventional printing structure 16. And the meter 10 includes conventional feeding structure 18 for feeding letters received by the meter 10, one at a time, in a predetermined path of travel 22, through the meter 10 as the printing structure 16 prints postage indicia on the letters 20. Further, the meter 10 includes one or more motors 24 which are each suitably coupled to the microprocessor 12 and to the printing and feeding structures, 16 and 18, preferably via one or more drivers 28 which are each conventionally connected to the appropriate structure, 16 or 18. Still further, the meter 10 includes a plurality of sensors 30. Some of the sensors 30 are each operatively associated with the feeding structure 18 for conventionally sensing the presence or absence of each letter 20 at respective relevant positions in the path of travel 22. Other sensors 30 are each operatively associated with either selected elements of the motors 24 or printing structure 16 for conventionally sensing respective relevant positions thereof. And all of the sensors 30 are each suitably connected to the microprocessor 12 for providing conventional data signals to thereto which are representative of the aforesaid relevant positions of letters 18, and elements of the motors 24 or printing structure 16. In addition, the postage meter 10 includes a conventional power supply 32 which is suitably adapted to be connected to an external source of supply of power for energization of the meter 10. Further, the meter 10 includes a suitable display 34 which is conventionally connected to the microprocessor 12 for operation in response to conventional signals received therefrom. Moreover, the meter 10 includes a plurality of, i.e., preferably two, non-volatile memories (NVMs), 36 and 38, for redundantly storing accounting data which is critical to the operation of the postage meter 10. Thus each of the non-volatile memories, 36 and 38, stores data corresponding to the total postage value which is available for printing in whole or in part by the printing structure 16, and, in addition, preferably stores data corresponding to the total value of all postage printed by the printing structure 16. In addition, each of the NVMs, 36 and 32, preferably has stored therein the serial number assigned to the postage meter 10 by the manufacturer thereof. And, each of the NVMs, 36 and 38 is conventionally coupled to the microprocessor 12 for receiving signals therefrom which corresponds to any and all data which is to be stored therein. Still further each of the NVMs, 36 and 38, includes a plurality of address spaces 40 for non-volatile storage of data in the NVM. Moreover, each of the NVMs, 36 and 38, preferably includes a plurality of working registers 42 for receiving and temporarily storing therein bytes of data. And, each of the NVMs, 36 and 38, includes conventional program circuitry 44 for transferring respective bytes of data stored in the working registers 42 to the address spaces 40.

As shown in FIG. 2, the microprocessor 12 generally comprises a plurality of discrete circuits, including those for a central processing unit, including a plurality of control circuits 50, a program counter 52, a plurality of working registers 54 and an arithmetic logic unit 56, and those for an oscillator and clock 58, data memory 60, timer and event counters 62 and program expansion control 64. Further, the microprocessor 12 comprises a plurality of additional discrete circuits including those for a plurality of program memories, including a main line program memory 66 and a meter shut down routine 68. Moreover, the microprocessor 12 preferably includes a plurality of spare registers 70 for future use as working registers or for future programming. And, the microprocessor 12 includes a plurality of serial and other programmable ports 72 which are conventionally interconnected as hereinbefore discussed to the printer 16, feeder 18, motors 24, drivers 28 sensors 30 and display 34, and for communicating with the keyboard 14 and NVMs, 36 and 38.

According to the invention methods and apparatus are provided for automatically identifying certain operational characteristics of the NVMs, 36 and 38, (FIG. 1) which are installed in the postage meter 10 at the time of manufacture thereof, and storing data corresponding to the such characteristics to facilitate subsequent use of the NVMs, 36 and 38, in the course of normal operation of the meter 10.

In particular, in the course of manufacture of each meter 12 (FIG. 1), NVMs, 36 and 38, are purchased from different qualified manufacturers and installed in the meter 10 without regard to matching the programming mode of operation of the NVMs, 36 and 38, or their page size, to processing steps which are be implemented by the main line program 64 for writing data thereto, in order to reduce the cost of manufacturing meters 12. The reduction in manufacturing costs is realized through savings from taking advantage of price differentials between different types of NVMs, 36 and 38, and different suppliers thereof, and from the reduction in meter manufacturing time and thus the reduction in labor costs. As a result, methods and apparatus are provided for testing the NVMs, 36 and 38, after installation thereof in the meter 10, to successively identify each NVM, 36 and 38, as a byte-write-type or page-write-type NVM and to determine the page size, i.e., 1, 16, 32 or 64 bytes of data, thereof.

For a better understanding of the invention it should be recognized that for the purpose of writing data to a byte-write-type NVM, 36 or 38, each byte of data is transferred from microprocessor 12 to the byte-write-type NVM, 36 or 38, within substantially one microsecond and thereafter stored in the byte-write-type NVM, 36 or 38, within substantially one millisecond. And, if an additional byte of data is written to a byte-write-type NVM, 36 or 38, during the one millisecond time interval, the additional byte of data will be ignored by a byte-write-type NVM, 36 or 38 because the byte-write-type NVM, 36 or 38, is occupied and cannot accept additional data during this interval. On the other hand, a page-write-type NVM requires successive bytes of data to be written thereto with a time delay interval of less than two hundred microseconds between bytes, since a delay of more than two hundred microseconds is interpreted by the NVM as an end of message signal. The page-write-type NVM requires a time interval of substantially ten milliseconds to store the series of bytes of data successively written thereto. Accordingly, for storing individual bytes of data one at a time in either a byte-write-type or page-write-type NVM, 36 or 38, successive bytes of data may be written thereto at intervals of substantially ten milliseconds. Assuming sixty-four bytes of data, each of which corresponds to the numeral one, are written in a byte-write-mode, and thus one at a time, during successive time intervals of ten milliseconds to a given address space of either a selected byte-write-type or page-write-type NVM, 36 or 38, each of the sixty four bytes of data will be successively stored in the selected NVM, 36 or 38.

If, subsequent to storing the series of bytes of data corresponding to the numeral one in the selected NVM, 36 or 38 (FIG. 1), a second series of sixty-four bytes of data, each corresponding to the numeral two, are written in a page-write-mode to the same address space of the selected NVM, 36 or 38, and the selected NVM, 36 or 38, is assumed to be a byte-write-type NVM, then, since all sixty-four bytes of data are written within substantially fifty microseconds and since the selected NVM, 36 or 38, is a byte-write type NVM, it will commence storing the first byte of data and miss the remaining sixty three bytes of data, due to the storage time for the first byte of data being substantially one millisecond, and thus much greater than fifty microseconds. Thus, assuming the selected NVM, 36 or 38, is a byte-write-type NVM, only one byte of data corresponding to the numeral two will be stored in the selected NVM, 36 or 38, in place of one of the bytes of data corresponding to the numeral one originally stored therein. Accordingly, rather than assume that a selected NVM, 36 or 38, is a byte-write-type NVM, one will conclude that, if solely one changed byte, i.e., one newly stored byte of data which is written over the originally stored byte, of data is stored in the selected NVM after initially byte-write-mode writing a predetermined page size of data thereto for storing in an address space thereof, at time intervals between bytes that exceed the page programming time interval ("slow byte write") and then page-write-mode writing the same page size of different data thereto for storing in the same address space. Moreover, one may conclude that the page size of the selected NVM is equal to the number of changed bytes of data stored therein.

On the other hand, if, subsequent to storing the series of bytes of data corresponding to the numeral one in the selected NVM, 36 or 38, a second series of sixty-four bytes of data, each corresponding to the numeral two are written in a page-write-mode to the same address space of the selected NVM, 36 or 38, and the selected NVM, 36 or 38, is assumed to be a page-write-type NVM, then, the selected NVM, 36 or 38, will successively store all sixty-four bytes of data therein in place of the bytes of data corresponding to the numeral one, within substantially ten milliseconds from the completion of writing the bytes of data thereto. Moreover, the successive bytes of data will be successively stored in the selected NVM independently of the page size of the selected NVM. In this connection it is noted that if the page size of the assumed page-write-type NVM is sixteen bytes, and sixty-four bytes of data are page-write mode written thereto, then, the first successive sixteen bytes will be stored in the address space in place of sixteen bytes of data corresponding to the numeral one which were stored therein in the course of the slow byte-write-mode writing to the NVM. Thereafter the second successive sixteen bytes of data of the sixty-four bytes of data page-write-mode written to the NVM will be successively stored in place of the first sixteen bytes of data successively page-write-mode written to the NVM. And so on, until the fourth successive sixteen bytes of data of the sixty-four bytes of data page-write-mode written to the NVM are successively stored in place of the third sixteen bytes of data successively page-write-mode written to the NVM. Accordingly, rather than assume that a selected NVM, 36 or 38, is a page-write-type NVM, one may conclude that it is, if more than one changed byte of data is stored in the selected NVM, 36 or 38, after initially slow byte-write-mode writing a predetermined page size of data thereto for storing in an address space thereof, and then page-write-mode writing the same predetermined page size of data to the selected NVM, 36 or 38, for storing in the same address space. Moreover, one may conclude that the page size of the NVM is equal to the number of changed bytes of data stored therein, assuming that the page size of data written to the selected NVM, 36 or 38, is the largest page size of any NVM, 36 or 38, used in the postage meter 10.

In consideration of the above discussion one may additionally conclude that after successively slow byte-write-mode and page-write-mode writing any predetermined page size of data to the same address space of a selected NVM, 36 or 38, (FIG. 1) as hereinbefore discussed, and then counting the number of changed bytes stored therein, if no changed byte is stored in the selected NVM, 36 or 38, the NVM is faulty. In addition, in consideration of the above discussion it should be noted that the predetermined page size of data written to a selected NVM, 36 or 38, is preferably the largest page size of any NVM 36 or 38 which is commercially available in the market place and supplied to any manufacturer of postage meters 10 for use therein, in order to be sure that the page size corresponds to the number of changed bytes as discussed above. Further, it is within the scope of the invention to use successive numerals other than from the numeral two, for example the numerals one through sixty-four inclusive when page-write-mode writing to a selected NVM, 36 or 38, it being noted that the number of individual byte storage registers of the address space that need be counted for identifying the page size of a given page-write-type NVM will thereby be reduced, inasmuch as the page size of a given page-write-type NVM, 36 or 38, may then be determined by identifying the numeral stored in the first byte storage register of the address space of the NVM.

For implementing the above-discussed invention, the microprocessor 12 (FIG. 2) includes an additional discrete circuit programmed for implementing a test routine 74, including circuitry programmed for determining whether or not it is the first time the meter has been operated, for selecting one of the plurality of NVMs not previously selected, for byte-write-mode writing data having a predetermined page size to the selected NVM for storage in the address space thereof, for page-write-mode writing different data having the predetermined page size to the selected NVM for storage in the address space thereof, for counting the number of changed bytes in the address space of the NVM, for identifying and storing data identifying the selected NVM as a page-write-type NVM if more than one changed byte of data is counted, for identifying and storing data identifying the selected NVM as a byte-write-type NVM if solely one changed byte of data is counted, for identifying and storing the selected NVM as a faulty NVM if no changed byte of data is counted, for storing data identifying the page size of the selected NVM as equal to the number of changed bytes changed; for successively selecting each of the plurality of NVMs and for causing the circuit to shut down operation of the postage meter if the selected NVM is identified as faulty.

Figure 3B:
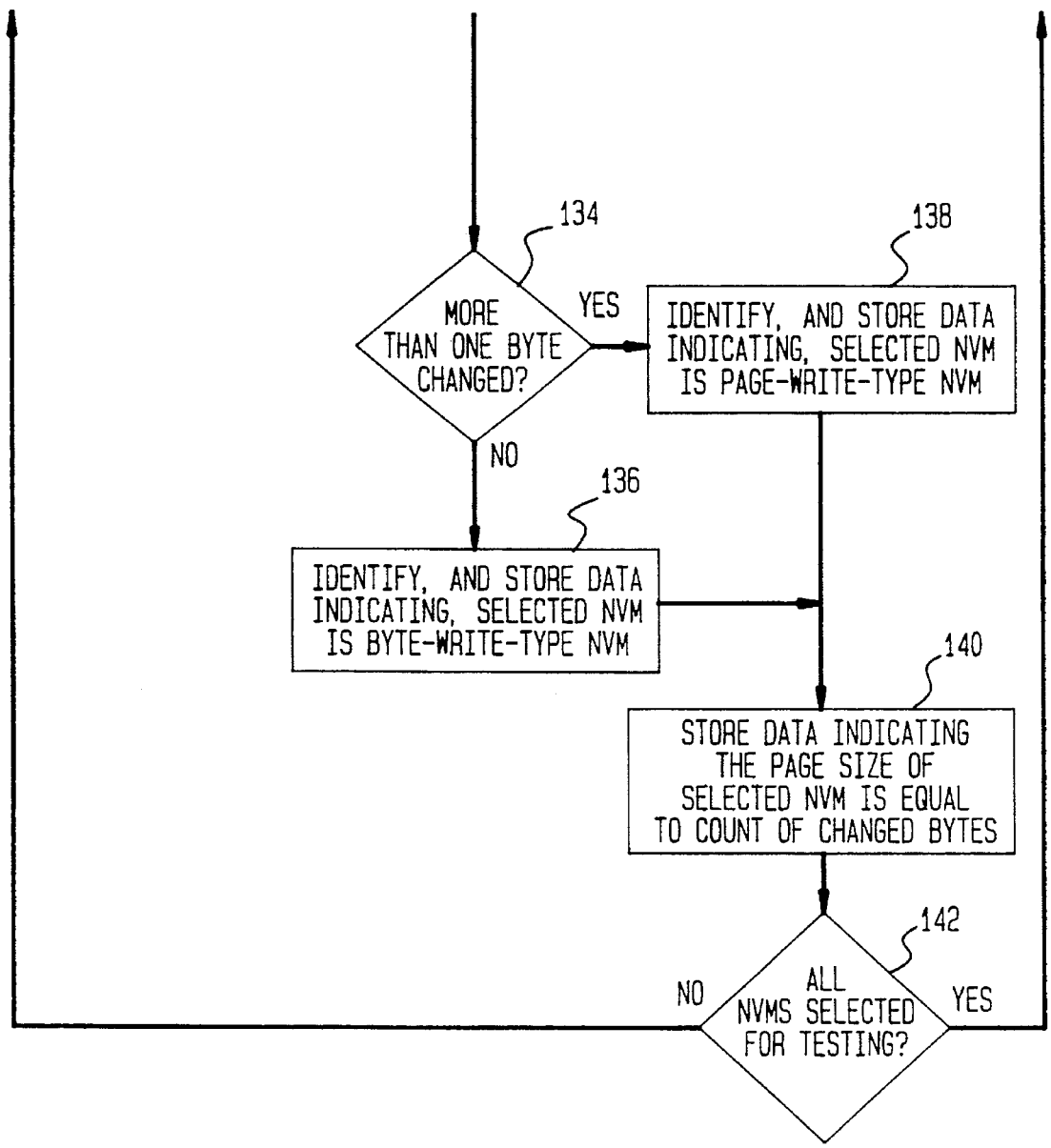
FIG. 3 is an accumulation of FIG. 3A and FIG. 3B which together represent a flow chart showing the process according invention.

As shown in FIG. 3, the main line program 100 stored in the memory 66 (FIG. 2) commences with the step 102 (FIG. 3) of conventionally initializing the microprocessor 12, which generally includes establishing the initial voltage levels at the interface ports 72 (FIG. 2) and setting the timer and event counters 62. Thereafter, the microprocessor 12 executes the step 104 (FIG. 3) of initializing various structures of the postage meter 12 (FIG. 1) including the printer 16, drivers 28 and motors 24, for example by scanning the various microprocessor ports 70 (FIG. 2) associated therewith and with the sensors 30 (FIG. 1) for determining whether or not the selected elements of the printer 16, drivers 28 and motors 24 are properly located for initiating operation of such structures, 16, 24 and 28, and, if not, causing the drivers 28 and motors 24 to drive such elements to their respective home positions.

Assuming the initialization steps, 102 and 104 (FIG. 3), are completed, the main line program 100 enters an idle loop routine, step 106. In the idle loop route, step 106, a determination is initially made as to whether or not a request or command has been received, step 108, for example from the operator interface 14 (FIG. 1). Assuming a request or command has not been received, step 108, processing is returned to idle 106, until a request or command is received. Whereupon, a determination is made as to whether or not it is the first time the postage meter 10 has been operated, step 110. Assuming it is not the first time the postage meter has been operated, step 110, the program 100 implements the step 112 of causing the request or command to be executed, followed by implementing the step 114 of indicating that the request or command has been executed and then returning processing to idle 106. Assuming however that it is the first time the postage meter has been operated, step 110, the main line program 100 executes the step 116 of jumping to the test routine memory 74 (FIG. 2) for identifying and storing data corresponding to operating characteristics of the NVMs, 36 and 38 (FIG. 1). The test routine, step 116, initially executes the step 118 of selecting an NVM not previously selected followed by the step 120 of causing the microprocessor 12 to use a byte-write-mode to write a selected page size of data to an address space of the selected NVM. Thereafter, the test routine executes the step 122 of causing the microprocessor 12 to use a page-write-mode to write the selected page size of different data to the address space of the selected NVM, followed by the step 124 of counting the number of changed bytes of data in the address space of the selected NVM. Then the test routine 116 causes the microprocessor 12 to execute the step 126 of making a determination as to whether or not no changed bytes have been counted. Assuming no changed bytes have been counted, the routine executes of the step 128 of causing an error flag to be posted, step 128, followed by causing the test routine 116 to jump to a conventional meter shut down routine, step 130, which routine, executes the step 132, of causing shut down of the postage meter 132 and then returning processing to idle, step 106. If, however, a byte change has been counted, step 126, then, the test routine executes the step 134 of causing a determination to be made as to whether or not more than one changed byte has been counted. Assuming more than one changed byte has not been counted, then the test routine implements the step 136 of identifying the selected NVM as a byte-write-type NVM and storing data in an available register of the microprocessor for permanently identifying the selected NVM as a byte-write-type NVM. Assuming however, that more than one changed byte has been counted, step. 134, then, the test routine executes the step 138 of identifying the selected NVM as a page-write-type NVM and storing data in available register of the microprocessor for permanently identifying the selected NVM as a page-write-type NVM. After implementation of either step 136 or step 138, then the test routine implements the step 140 of causing data to be permanently stored in yet another available register which identifies the page size of the selected NVM as equal to the number of changed bytes counted, followed by the step 142 of making a determination as to whether or not all of the NVMs, 36 and 38, have been selected for testing. Assuming that they have not, the routine reenters the test routine and again implements the step 118 of selecting an NVM not previously selected 118, followed by successively implementing the remaining steps of the test routine 118. On the other hand, assuming all NVMs have been selected for testing, step 142, then, the routine returns processing to the main line program, idle step 106, to await the next request or command, step 108.

In accordance with the objects of the invention there has been described an improved postage meter including methods and apparatus for testing an NVM, and more particularly, there has been described an electronic circuit including a microprocessor having means programmed for testing a selected NVM to identify and store data identifying, operational characteristics of the selected NVM.

What is claimed is:

1. Apparatus for testing the operational characteristics of an NVM comprising:
   (a) a microprocessor
   (b) a plurality of NVMs respectively connected to the microprocessor, each of the NVMs having an address space for storing data therein; and
   (c) the microprocessor including:
      i. means for selecting one of the plurality of NVMs;
      ii. means for byte-write-mode writing first data byte-by-byte having a predetermined page size of bytes to the selected NVM for storage in the address space thereof;
      iii. means for page-write-mode writing second data bytes-by-bytes having the predetermined page size of bytes to the selected NVM for storage in the address space thereof; and
      iv. means for counting the number of bytes in the address space of the selected NVM that have changed as a result of writing the second data, after previously having written the first data, to the selected NVM where the operational characteristics of the selected NVM are dependent on the number of changed bytes.

2. The apparatus according to claim 1, wherein the microprocessor includes means for storing data identifying the selected NVM as a page-write-type NVM if the number of changed bytes is more than one.

3. The apparatus according to claim 1, wherein the microprocessor includes means for storing data identifying the selected NVM as a byte-write-type NVM if the number of changed bytes is equal to one.

4. The apparatus according to claim 1, wherein the microprocessor includes means for storing data identifying the selected NVM as a faulty NVM if the number of changed bytes is equal to zero.

5. The apparatus according to claim 1, wherein the microprocessor includes means for storing data identifying the page size of the selected NVM as equal to the number of changed bytes.

6. The apparatus according to claim 1, wherein the selecting means for successively selects each of the plurality of NVMs.

7. The apparatus according to claim 4 further comprising a circuit for controlling operation of the apparatus and means for causing said circuit to shutdown the operation of the apparatus if the selected NVM is identified as faulty.

8. In an electronic circuit including an NVM having an address space, a method of testing the operational characteristics of the NVM comprising the steps of:
   (a) byte-write-mode writing first data byte-by-byte having a predetermined page size of bytes to the NVM for storing in the address space thereof;
   (b) page-write-mode writing second data bytes-by-bytes having the predetermined page size of bytes to the NVM for storing in the address space thereof; and
   (c) counting each byte in the address space of the NVM that has changed as a result of writing the second data, after previously having written the first data, to the NVM where the operational characteristics of the NVM are dependent on the number of changed bytes.

9. The method according to claim 8 further including the step of identifying the NVM as a byte-write-type NVM if the number of changed bytes is equal to one.

10. The method according to claim 8 further including the step of identifying the NVM as a page-write-type NVM if the number of changed bytes is more than one.

11. The method according to claim 8 further including the step of identifying the NVM as a faulty if the number of changed bytes is equal to zero.

12. The method according to claim 8 further including the step of identifying the page size of the NVM as equal to the number of changed bytes.

13. The method according to claim 8 further including the steps of: providing a microprocessor; connecting the NVM to the microprocessor; and programming the microprocessor for implementing steps (a) through (c) inclusive.

14. The method according to claim 8 further including the step of causing the circuit to shutdown operation thereof if the number of changed bytes is equal to zero.

15. The method according to claim 8 further including the step of providing an error indication if the number of changed bytes is equal to zero.

16. The method according to claim 8, wherein the circuit includes a plurality of NVMs, and further including the step of selecting the NVM from the plurality of NVMs.

17. The method according to claim 8 including the step of storing data identifying the NVM as a byte-write-type NVM if the number of changed bytes is equal to one.

18. The method according to claim 8 including the step of storing data identifying the NVM as a page-write-type NVM if the number of changed bytes is more than one.

19. The method according to claim 8 including the step of storing data identifying the NVM as having a page size equal to the number of changed bytes.

20. A postage meter comprising:
   (a) means for printing postage indicia;
   (b) a microprocessor connected to and programmed for controlling the postage printing means;
   (c) a plurality of NVMs respectively connected to the microprocessor, each of the NVMs having an address space for storing data therein; and
   (d) the microprocessor including:
      i. means programmed for selecting one of the plurality of NVMs;
      ii. means programmed for byte-write-mode writing first data byte-by-byte having a predetermined page size of bytes to the selected NVM for storage in the address space thereof;
      iii. means programmed for page-write-mode writing second data bytes-by-bytes having the predetermined page size of bytes to the selected NVM for storage in the address space thereof; and
      iv. means programmed for counting the number of bytes in the address space of the selected NVM that have changed as a result of writing the second data, after previously having written the first data, to the selected NVM.

21. The postage meter according to claim 20, wherein the microprocessor includes means programmed for storing data identifying the selected NVM as a page-write-type NVM if the number of changed bytes is more than one.

22. The postage meter according to claim 20, wherein the microprocessor includes means programmed for storing data identifying the selected NVM as a byte-write-type NVM if the number of changed bytes is equal to one.

23. The postage meter according to claim 20, wherein the microprocessor includes means programmed for storing data identifying the selected NVM as a faulty NVM if the number of changed bytes is equal to zero.

24. The postage meter according to claim 20, wherein the microprocessor includes means programmed for storing data identifying the page size of the selected NVM as equal to the number of changed bytes.

25. The postage meter according to claim 20, wherein the microprocessor includes means programmed for successively selecting each of the plurality of NVMs.

26. The postage meter according to claim 20 including means programmed for causing shutdown of operation of the postage meter if the selected NVM is identified as faulty.

27. In a postage meter including postage printing means, a microprocessor connected to and programmed for controlling the postage printing means, and an NVM having an address space, a method of testing the operational characteristics of the NVM comprising the steps of:
   (a) byte-write-mode writing first data byte-by-byte having a predetermined page size of bytes to the NVM for storing in the address space thereof;
   (b) page-write-mode writing second data bytes-by-bytes having the predetermined page size of bytes to the NVM for storing in the address space thereof; and
   (c) counting each byte in the address space of the NVM that has changed as a result of writing the second data, after previously having written the first data, to the NVM where the operational characteristics of the NVM are dependent on the number of changed bytes.

28. The method according to claim 27 including the step of identifying the NVM as a byte-write-type NVM if the number of changed bytes is equal to one.

29. The method according to claim 27 including the step of identifying the NVM as a page-write-type NVM if the number of changed bytes is more than one.

30. The method according to claim 27 including the step of identifying the NVM as a faulty if the number of changed bytes is equal to zero.

31. The method according to claim 27 including the step of identifying the page size of the NVM as equal to the number of changed bytes.

32. The method according to claim 27 including the step of causing the postage meter to shutdown operation thereof if the number of changed bytes is equal to zero.

33. The method according to claim 27 including the step of providing an error indication if the number of changed bytes is equal to zero.

34. The method according to claim 27 including the step of selecting the NVM from a plurality of NVMs.

35. The method according to claim 27 including the step of storing data identifying the NVM as a byte-write-type NVM if the number of changed bytes is equal to one.

36. The method according to claim 27 including the step of storing data identifying the NVM as a page-write-type NVM if the number of changed bytes is more than one.

37. The method according to claim 27 including the step of storing data identifying the NVM as having a page size equal to the number of changed bytes.

* * * * *